United States Patent [19]

Champiau

[11] Patent Number: 4,890,183
[45] Date of Patent: Dec. 26, 1989

[54] DEVICE FOR DETECTING CUTOFF AND SHORT CIRCUIT DEFECTS IN AT LEAST ONE ELECTRICAL CIRCUIT PORTION

[75] Inventor: Robert Champiau, Villemoisson sur Orge, France

[73] Assignee: Bull S.A., Paris, France

[21] Appl. No.: 346,213

[22] Filed: May 2, 1989

[30] Foreign Application Priority Data

May 4, 1988 [FR] France .................... 88 06003

[51] Int. Cl.$^4$ ............................. H02H 3/00
[52] U.S. Cl. ........................ 361/86; 361/87;
361/169.1; 361/187
[58] Field of Search ............. 361/86, 87, 93, 160,
361/166, 167, 168.1, 169.1, 187, 189, 190

[56] References Cited

U.S. PATENT DOCUMENTS

| | | | |
|---|---|---|---|
| 3,771,048 | 11/1973 | Bond et al. | 324/28 |
| 4,065,802 | 12/1977 | Mizukawa et al. | 361/86 X |
| 4,470,041 | 9/1984 | Sutherland et al. | 340/644 |
| 4,661,766 | 4/1987 | Hoffman et al. | 361/160 X |
| 4,783,714 | 11/1988 | Kalina | 361/93 X |

FOREIGN PATENT DOCUMENTS 2614748 10/1977 Fed. Rep. of Germany .
1496316 10/1966 France .

OTHER PUBLICATIONS

IBM Tech. Disc. Bul., vol. 24, No. 7B, Dec. 1981, pp. 3743–3744.

Primary Examiner—Derek S. Jennings
Attorney, Agent, or Firm—Kerkam, Stowell, Kondracki & Clarke

[57] ABSTRACT

The invention relates to a device for detecting cutoff and short circuit defects in at least one electrical circuit portion. The detecting device (10) is intended to verify a circuit portion (11) connected to the terminals of a source of direct current (T1) and including a passive element (E, r) interposed between two switch devices (P, Q) comprises on the one hand four differential amplifiers (AD1, AD2, AD3 and AD4) each having one of their inputs connected to the common terminal (F) of the passive element (E, r) and to the first switch device (P) and their other input connected to a reference potential (V3 or V4), and on the other hand another voltage source (T2) and two resistors (R1 and R2) which are selected such that in the case of short-circuiting of the devices (P and Q), a signal appears at the output (X1 or X2) of one of the amplifiers AD1 and AD2, while in the case of cutoffs in one or the other of the circuit portions located on either side of this terminal (F)< a signal appears at the output (X3 or X4) of one or the other amplifier (AD3 and AD4). The invention relates to monitoring of circuits that control the excitation of recording heads in magnetic recording apparatus.

21 Claims, 4 Drawing Sheets

DEVICE FOR DETECTING CUTOFF AND SHORT CIRCUIT DEFECTS IN AT LEAST ONE ELECTRICAL CIRCUIT PORTION

FIELD OF THE INVENTION

The present invention relates to a device for detecting cutoff and short circuit defects in at least one electrical circuit portion, formed by at least one non-capacitive element interposed between two switch devices. Such a detector is used more particularly, but not exclusively, in detecting defects in matrix sets, such as those typically used to control the magnetic heads of a magnetic recording device.

BACKGROUND OF THE INVENTION

For several decades, magnetic recording devices used for recording data, such as magnetic drum memories or magnetographic printers, have included a magnetic recording carrier, most often comprising a magnetic drum or endless belt coated with a magnetic film. Recording of the data on this carrier is performed by means of a recording device that includes a plurality of magnetic recording heads, in proximity with which the recording carrier is displaced. Each time one of the heads is excited for a brief instant by an electric current of suitable intensity, it generates a magnetic field, the effect of which is to create magnetized domains of small dimensions on the surface of the recording carrier moving past the heads. These virtually point-shaped domains are typically known as magnetized points.

These heads, each of which comprises a magnetic core about which an excitation winding has been wound, are typically disposed side by side and are aligned in a direction perpendicular to the direction of displacement of the recording carrier. The excitation windings of these heads are controlled by an electrical excitation circuit, which from the utilization standpoint is most often a structure of the matrix type. In other words, in this structure, the excitation windings of the heads are distributed into p groups, each including n windings, and one of the ends of each winding is connected to one of the terminals of a source of electrical current via one of n first switch devices, each of these n switch devices being associated respectively with a corresponding winding of the n windings of each group. The other end of each winding is connected to the other terminal of the source, via one of p second switch devices, and these p switch devices are each associated respectively with a corresponding group of the p winding groups. Under these conditions, it will be understood that the electrical excitation of a winding is obtained by simultanously closing the first switch device, which is associated with that winding, and the second switch device, which is associated with the group to which this winding belongs. By definition, during normal function, as long as the excitation circuit is not detective in any way, the simultaneous closure of a first switch device and a second switch device always has the effect of causing an electrical current to flow in a circuit portion comprising these two switch devices and through the winding whose ends are connected to these two switch devices.

However, a cutoff or current interruption may occur in this circuit portion, which could be due either to a defective closure of one or more of the two switch devices of this portion, for instance from wear, or to a break in the winding or breakage of the solder connections connecting this winding to the two switch devices. In that case, if it is desired to close these two switch devices, excitation of the winding interposed between these two devices cannot be attained. Conversely, it may happen that a switch device that is placed in the closing position remains locked in that position at the end of the normal period for closure. In that case, the winding of which one end is connected to that switch device will be involuntarily excited when the other switch device that is connected to the other end of this winding is closed. This involuntary excitation translates into the recording of undesired data on the surface of the recording carrier.

To eliminate the risk of recording error following a cutoff, a bad contact, or a short circuit occurring in a portion of the electrical excitation circuit, the prior art has proposed various detection devices capable of detecting defects in the functioning of such a circuit. For instance, a known verification device described in French Pat. No. 1.496.316, in order to detect that the excitation winding wound about the core of a magnetic recording head has indeed been excited by recording control signals furnished by a control circuit, includes a supplementary winding wound about the core of the head and a comparator, the task of which is on the one hand to compare the signals that are induced in this supplementary winding with those that have been furnished by the control circuit and on the other hand to generate an error indication signal when agreement is not found between the compared signals.

Another device for detecting defective functioning is described in IBM Technical Disclosure Bulletin, Vol. 27, No. 9, February 1985, pp. 5464–5465. This device, comprising an analog circuit connected in parallel with the terminals of a resistor inserted into the circuit portion to be tested, furnishes an error indication signal when the intensity of the current flowing in this portion is above a predetermined threshold value.

Although these detection devices are suitable for detecting functional defects occurring in a circuit that includes a small number of circuit portions, still they would not be usable for detecting defects occurring in a great number of circuit portions, because the number of devices necessary for this detection would have equal to the number of circuit portions to be tested, which naturally would greatly increase the cost price of the machines that would be equipped with the device.

Furthermore, with these devices, verification of the status of a circuit portion cannot be done except if this circuit portion has an electrical current flowing through it at a intensity that equals a fixed predetermined value. Hence the status of the excitation winding of a magnetic recording head, for instance, is verified only if this winding has a current passing through it of sufficient intensity to cause the recording of a datum onto the recording carrier. If the excitation winding were cut, the absence of a signal induced in this supplementary winding of the head would indicate the presence of a defect in the excitation winding. If the current intensity flowing in the excitation winding of the head, with the winding intact, were considerably reduced, in order merely to verify the status of the winding without recording data on the recording carrier, then that device could not determine whether the excitation winding of the head is functioning properly, because the amplitude of the signal induced in the supplementary winding of the head would be zero, or at least much too feeble to conclude with certainty that the excitation winding is free of defects.

By definition, these detection devices prove to be incapable of verifying the status of circuit portions at any time other than the normal excitation periods of these portions.

OBJECT AND SUMMARY OF THE INVENTION

The present invention overcomes these disadvantages and proposes a detection device that is relatively simple in structure yet is capable of verifying the status of a large number of circuit portions, doing so at times other than the normal excitation periods of these circuit portions. This detection device is arranged to detect cutoffs and short circuits taking place in at least one circuit portion including at least one passive, non-capacitive element, such as a resistor, diode, or coil, interposed between two switch devices, which may comprise relay contacts or transistors.

More precisely, the present invention relates to a device for detecting cutoffs and short circuits occurring in at least one electrical circuit portion, embodied by at least one passive, non-capacitive element having a first end and a second end, a first switch device mounted between the first end and a first terminal of a source of direct voltage, and a second switch device mounted between the second end and the second terminal of the voltage source; according to the invention, the device includes a discriminator circuit, provided on the one hand with an input connected to the first end and on the other hand with four outputs, and this discriminator circuit is arranged to furnish a different configuration of signals at its outputs, depending on whether each of the two parts of the circuit portions that are located on either side of the first end have a cutoff defect or a short-circuit defect.

The invention will be better understood and further objects, details and advantages will become more apparent from the ensuing description of a purely exemplary embodiment, taken in conjunction with the accompanying drawings.

BRIEF DESCRIPTION OF THE DRAWINGS

FIGS. 2A, 2B and 2C are to be assembled.

DESCRIPTION OF THE PREFERRED EMBODIMENT

Figure 1:
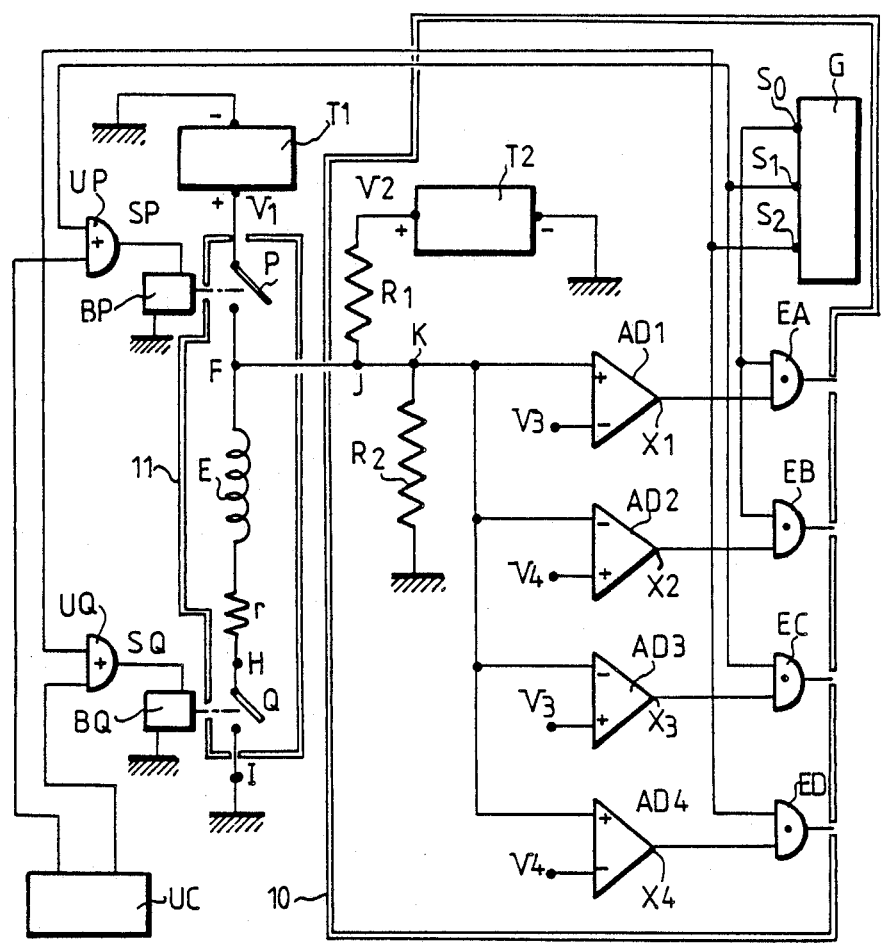
FIG. 1 is the general wiring diagram of a detection device according to the invention, used for detecting defects that may occur in a single electrical circuit portion.

FIG. 1 is intended to show the general construction of a detection device 10, embodied according to the invention, for detecting cutoffs or short circuits that may occur in an electrical circuit portion. In the example shown in this figure, this circuit portion, symbolically represented inside a box identified by reference numeral 11, includes a first switch device P, a winding E, a resistor r and a second switch device Q, all these elements being connected in series such that this winding E and this resistor r are interposed between the two switch devices P and Q, and the set of all these elements being connected to the terminals of a direct voltage source T1. More precisely, since the positive terminal (+) of this source T1 is connected to the switch device P, the negative terminal (−) of this source is connected to ground, as is the free terminal I of this switch device Q. It should also be noted that the resistor r may also represent the resistance of the winding E or any resistor that would be connected in series with this winding and the resistance of which would take into account the resistance of this winding. In FIG. 1, V1 represents the potential value of the positive terminal (+) of the source T1 with respect to ground. Also, F represents the terminal of the first switch device P that is connected to one of the ends of the winding E, and H is the terminal of the second switch device Q that is connected to one of the ends of the resistors r.

In the example illustrated by FIG. 1, it is assumed that the two switch devices P and Q comprise contacts each placed under the respective control of two relay coils BP and BQ. Each of these contacts is normally open, as long as the coil that controls it is not excited. Contrarily, each time an electrical voltage SP is applied to the coil BP, this coil is excited and closes its contacts P. Similarly, each time an electrical voltage SQ is applied to the coil BQ, this coil is excited and closes its contact Q. It will be understood under these conditions that normally, when the electrical voltages SP and SQ are applied simultaneously to the coils BP and BQ, the contacts P and Q close simultaneously, and so a direct current flows from the positive terminal of the source T1 into the circuit portion 11 comprising the two contacts P and Q, the winding E and the resistor r.

However, it may happen that wear, for example, causes the contact P to close poorly or not at all when voltage is applied to the coil BP. In that case, the contact P, which is urged into a closure position, is said to have a cutoff defect. In that case, no electrical current at all can flow into the circuit portion 11. More generally, this circuit portion cannot have an electrical current circulate in it when the coils BP and BQ are both excited, unless this portion includes no cutoff. Such a cutoff may equally be due to a defect in closure of the contacts P and Q or to any other accidental cutoff, such as the breakage of one of the welds performed to connect the various elements of this circuit portion to one another.

Thus as will be seen below, the detection device 10 is arranged to detect the presence of an accidental cutoff of any kind in this circuit portion 11.

It may happen, for instance from a lessening in the elasticity of the blade comprising the contact P, that this contact, which has been closed following the application of a voltage to the coil BP, remains closed after the disappearance of this voltage. In that case, the contact P, which is urged into the opening position, is said to have a short-circuit defect. Under these conditions, if it is desired to apply a voltage SQ to the voltage BQ so as to close the contact Q without seeking to excite the winding E, which may be done for reasons that will be explained hereinafter, an undesirable electrical current known as a short circuit will necessarily pass through this winding E and the resistor r. Similarly, a short-circuit current will flow in the winding E and the resistor r in the case where the contact Q is short-circuited and a voltage is applied solely to the coil BP to close the contact P. The detection device 10 makes accurate detection possible, as will be seen hereinafter, of accidental short circuits in the contacts P and Q.

Before the structure of the detection device 10 is described, it will be useful to note the voltages SP and SQ that are applied simultaneously to the coils BP and BQ during the normal excitation periods of the winding E originate in a control unit UC and are transmitted to these coils BP and BQ via respective OR circuits UP and UQ.

These voltages that thus are applied simultaneously to the coils BP and BQ cause the simultaneous closure of the contacts P and Q. Consequently, an electrical current of relatively high intensity flows through the winding E, that is, a current having an intensity on the order of 240 mA, in the example described. However, this kind of normal excitation of the winding E is not an absolute necessity, since properly speaking it does not relate to the present invention. However, it should be noted that the detection device 10 to be described now is arranged to monitor the status of the circuit portion 11 outside the normal excitation periods of the winding E, or in other words at times other than the periods when the control unit UC furnishes voltages intended for simultaneously exciting the coils BP and BQ.

Thus as can be seen in FIG. 1, the detection device 10 includes two resistors R1 and R2, of which R1 has an end J connected to one end K of the other resistor R2; these two resistors are accordingly connected in series between the positive terminal (+) of a second direct voltage source T2 and ground; the negative terminal of the source is also connected to ground, as is the other end of the resistor R2. In FIG. 1, V2 indicates the potential value of the positive terminal (+) of the voltage source T2 with respect to ground. The detection device 10 also includes four differential amplifiers AD1, AD2, AD3 and AD4, of known type. The inverting inputs (−) of the amplifiers AD2 and AD3 and the non-inverting (+) inputs of the amplifiers AD1 and AD4 are all connected together to the end K of the resistor R2. The end J of the resistor R1, which is connected to the end K, is also connected to the terminal F of the contact P. The inverting input (−) of the amplifier AD1 and the noninverting input (+) of the amplifier AD3 each receive a stable reference direct voltage of value V3. The non-inverting input (+) of the amplifier AD2 and the inverting input (−) of the amplifier AD4 each receive another stable reference direct voltage, of value V4. The resistance of the resistor R2 is selected to be relatively elevated, so as on the one hand to limit to a suitable value the intensity of the current that, when the contact P is closed, flows toward ground from the positive terminal of the source P1, via the closed contact P and the resistor R2, and on the other hand to prevent the intensity of the current that flows through the winding E during normal excitation periods when both the contacts P and Q are closed from being considerably attenuated with respect to the intensity of the current that would flow through this winding if the connection made between the terminal F and ground via the resistor R2 did not exist. Accordingly, in the exemplary embodiment shown in FIG. 1, the resistance of R2 is on the order of 800 to 1000 times that of the resistor r, the latter having a resistance on the order of 50 Ω. Similarly, the resistance of the resistor R1 is selected as relatively elevated, to prevent the winding E, when the contact Q is closed and the contact P is open, from having a relatively major current flowing through it, this current flowing to ground from the positive terminal of the source T2, via the resistor R1, the winding E, the resistor r and the closed contact Q. The source T2 and the resistor R1 are moreover selected in such a manner that when the contacts P and Q are both opened, the points F, J and K are carried to a potential, the value V5 of which with respect to ground is clearly less than the value V1 of the potential of the positive terminal (+) of the source T1; the value V5 of this potential may for example be equal to one-third this value V1. Thus in the example described, where the source T1 virtually equalling 12 V between its terminals, the source T2 is selected such as to have a voltage V2 virtually equal to 5 V between its terminals, and the resistor R1 is selected such that its resistance is virtually one-fourth that of the resistor R2, such that when the contacts P and Q are open, the points F, J and K are practically carried to a potential of 4 V with respect to ground. The value V3 of the reference voltage that is applied to the inverting input of AD1 and to the non-inverting input of AD3 is selected such that it is between the value V1 of the potential of the positive terminal (+) of the source T1 and the value V5 of the potential at which the point K is located when the contacts P and Q are open. The value V4 of the reference voltage that is applied to the non-inverting input of AD2 and to the inverting input of AD4 is selected such that it is less than this value V5. Hence, in the example described, where V5 is virtually equal to 4 V, the values of V3 and V4 are selected to equal 7 V and 2 V, respectively.

The differential amplifier AD1 is designed in a known manner for furnishing a continuous signal at its output X1 when the potential of the point K becomes greater than the value of the reference voltage V3. Similarly, the differential amplifier AD2 is designed to furnish a continuous signal at its output X2 when the potential of the point K becomes less than the value of the reference voltage V4; the differential amplifier AD3 is designed to furnish a continuous signal at its output X2 when the potential of the point K becomes less than the value of the reference voltage V3; and finally, the differential amplifier AD4 is designed to furnish a continuous signal at its output X4 when the potential of the point K becomes greater than the value of the reference voltage V4.

To monitor the status of the circuit portion the constitution of which has been described above, the detection device shown in FIG. 1 also includes a signal generator G, which is triggered in a manner to be described hereinafter at the end of a normal excitation period of the winding E; this generator is provided here with three outputs S0, S1 and S2 and is arranged so that beginning at the moment when it is triggered it furnishes a positive pulse at each of its three outputs in succession. The first pulse, which appears at the output S0 of the generator G, is applied to one of the inputs of two AND circuits EA and EB; each of these circuits includes two inputs. These two circuits EA and EB have their other input connected to the output X1 of the differential amplifier AD1 and the output X2 of the differential amplifier AD2, respectively. At the moment that a first pulse appears at the output S0 of the generator G, the coils BP and BQ are not excited. Under these conditions, if the circuit portion 11 to be tested has no defects, the contacts P and Q are open. Consequently, as explained above, the point K is carried to the potential V5 (remembering that in the example described, V5 equals 4 V), and consequently no signal appears at the outputs X1 and X2 of the differential amplifiers AD1 and AD2. As a result, the circuits EA and EB deliver no signal at their outputs in response to the pulse that is sent by the output S0 and applied to one of their two outputs.

Contrarily, if the contact P is short-circuiting, or in other words is closed when the coil BP is not excited, the point K is carried to the potential V1 (this potential being equal to 12 V, in the example described). In that case, since the potential at K is greater than V3, the differential amplifier AD1 furnishes a signal at its output X1. Consequently, when it receives the pulse sent via the output S0, the circuit EA furnishes a signal at its output, which thus indicates that the contact P is short-circuiting.

Now if the contact P is not short-circuiting or in other words remains open, but the contact Q is short-circuiting, then the winding E has a current flowing through it which from the positive terminal of the source T2 flows to ground, and the intensity of this current has a value I1, expressed as follows:

$$I1 = \frac{R2}{(R2 + r) R1 + R2 \cdot r} \cdot V2$$

Consequently, the point K is carried to a potential, the value V6 of which with respect to ground is expressed as:

$$V6 = r \cdot I1$$
$$V6 = \frac{R2 \cdot r}{(R2 + r) R1 + R2 \cdot r} \cdot V2$$

or, considering that the value of r is negligible with respect to that of R2 and that of R1, $$V6 \simeq \frac{r}{R1} \cdot V2$$

The order of magnitude of the resistors R1 and r and of the voltage V2 that are given above show that the potential V6 at K is quite close to 0. In fact, in the example described, where the voltage V2 is practically equal to 5 V and the resistors r and R1 have a resistance equal to virtually 50 Ω and 10,000 Ω, respectively, this potential V6 has a value substantially as follows:

$$V6 = \frac{50}{10,000} \cdot 5 = 25 \text{ mV}.$$

Consequently, since this potential V6 is less than V4 (V4 being equal to 2 V, in the example described), the differential amplifier AD2 furnishes a signal at its output X2. As a result, the circuit EB, when it receives the pulse sent by the outout S0 of the generator G, furnishes a signal at its output, which then indicates that the contact Q is short-circuiting.

FIG. 1 also shows that the second pulse that then appears at the output S1 of the signal generator G is applied on the one hand to one of the two inputs of an AND circuit EC, the other input of this circuit EC being connected to the output X3 of the differential amplifier AD3, and on the other hand, via the circuit UP, to the coil BP. Excited by this pulse, the coil BP then closes its contact P temporarily. If during this excitation period the closure of the contact P takes place correctly, the point K is temporarily connected to the potential of the positive terminal of the source T1, or in other words to the potential V1. Since the potential of the point K is then greater than V3, the amplifier AD3 furnishes no signal at its output X3. Consequently, the circuit EC, which does not receive the pulse originating in the output S1, furnishes no signal at its output.

On the other hand, it may happen that during the excitation period of the coil BP there is a cutoff in the part of the portion 11 located between the positive terminal of the source T1 and the terminal F, which may be due to either defective closure of the contact P or breakage of the wires or welds made at the terminals of the contacts P or the source T1. In that case, the the point K remains at the same potential as when the contacts P and Q are open, that is, the potential V5. Because the potential of the point K is then less than V3 (that is, 7 V in the example described), the amplifier AD3 furnishes a signal at its output X3. Consequently, the circuit EC, which simultaneously receives this signals and the pulse emitted at the output S1 of the generator G, furnishes a signal at its output, which then indicates that a cutoff has taken place in the part of the circuit 11 located between the terminal F and the positive terminal of the source T1.

The third pulse, which finally appears at the output S2 of the generator G, is applied as shown in FIG. 1 not only to one of the two inputs of an AND circuit ED, the other input of this circuit being connected to the output X4 of the differential amplifier AD4, but also to the coil BQ, via the circuit UQ. The coil BQ, excited by this pulse, then temporarily closes its contact Q. If the closure of the contact Q takes place correctly during this excitation period, the point K is located temporarily at the aforementioned potential V6 (recalling that in the example described the value of V6 is on the order of 25 mV). Since the potential of the point K is lower than the potential V4, the amplifier AD4 furnishes no signal at its output X4. Consequently the circuit ED, which receives only the pulse originating at the output S2, furnishes no signal at its output.

On the other hand, it may happen that during the excitation period of the coil BQ, a cutoff exists in the portion of the circuit 11, including the winding E and the resistor r, that is located between the terminal F and ground; this cutoff may be due to either defective closure of the contact Q or to breakage of the connecting wires or to conductors comprising the winding E and the resistor r, or to a rupture of the welds made to connect the constituent elements of this circuit portion with one another. In that case, the point K remains at the potential V5, since this potential is greater than the reference potential V4. Consequently, the amplifier AD4 furnishes a signal at its output X4, and the circuit ED, which simultaneously receives this signal and the pulse emitted at the output S2 of the generator, then furnishes a signal at its output, which thus indicates that a cutoff has been brought about in the circuit portion 11 included between the terminal F and ground.

From the above explanation, it will be understood that the four AND circuits EA, EB, EC and ED act as validation circuits for the signals that are furnished in the case of defects at the outputs X1, X2, X3 and X4 of the differential amplifiers AD1, AD2, AD3 and AD4. In fact, when the contacts P and Q are both urged to the opening position, the circuits EA and EB make it possible to take into account only the signals that appear at one of the outputs X1 and X2 in the case of a short circuit. Similarly, when the contact Q is open and the contact P is closed, the circuit EC makes it possible to take into account only the signal that appears at the output X3 in the event of a cutoff in the portion included between the positive terminal of T1 and the point F. Finally, when the contact P is open and the contact Q is closed, the circuit ED makes it possible to take into account only the signal that appears at the output X4 in the event of a cutoff in the portion included between the point F and ground.

It should be noted that in the exceptional case where the contacts P and Q both have a short-circuiting defect, the point K is carried to the potential V1. In that case, the amplifier AD1 does furnish a signal at its output X1, while the amplifier AD2 furnishes no signal at its output X2, even though the contact Q is short-circuiting. Consequently, the absence of a signal at the output X2 cannot be interpreted as indicating the absence of a short-circuiting defect of the contact Q, unless the contact P does not itself have a short-circuiting defect.

It should again be noted that in the course of monitoring, performed by the detection device 10 to verify the status of the circuit portion 11, the winding E never has a current of elevated intensity flowing through it, except in the exceptional case where both contacts P and Q are short-circuiting, or in the case where, with only one of these two circuits short-circuiting, the other contact is put in the closing position consecutive to the excitation of the coil that controls this other contact. In fact, except for these two cases, the intensity of the current that flows through the winding E in the course of this monitoring is zero, or (in the case where the contact P is open and the contact Q is closed) equals a value I1 which is negligible with respect to that of the current flowing through this winding when the winding is normally excited. Thus in the example described, from the values of R1, R2, r and V2 that are given above, this value I1 is on the order of 0.5 mA, while that of the current flowing through the winding when the winding is normally excited in on the order of 240 mA. By definition, except for these two cases, the intensity of the current flowing through the winding E in the course of this monitoring is too low to cause normal excitation of the winding.

Figure 2:
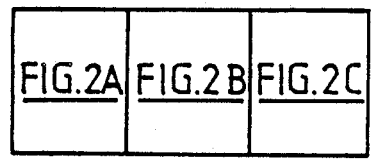
FIG. 2 shows how
Figure 2A:
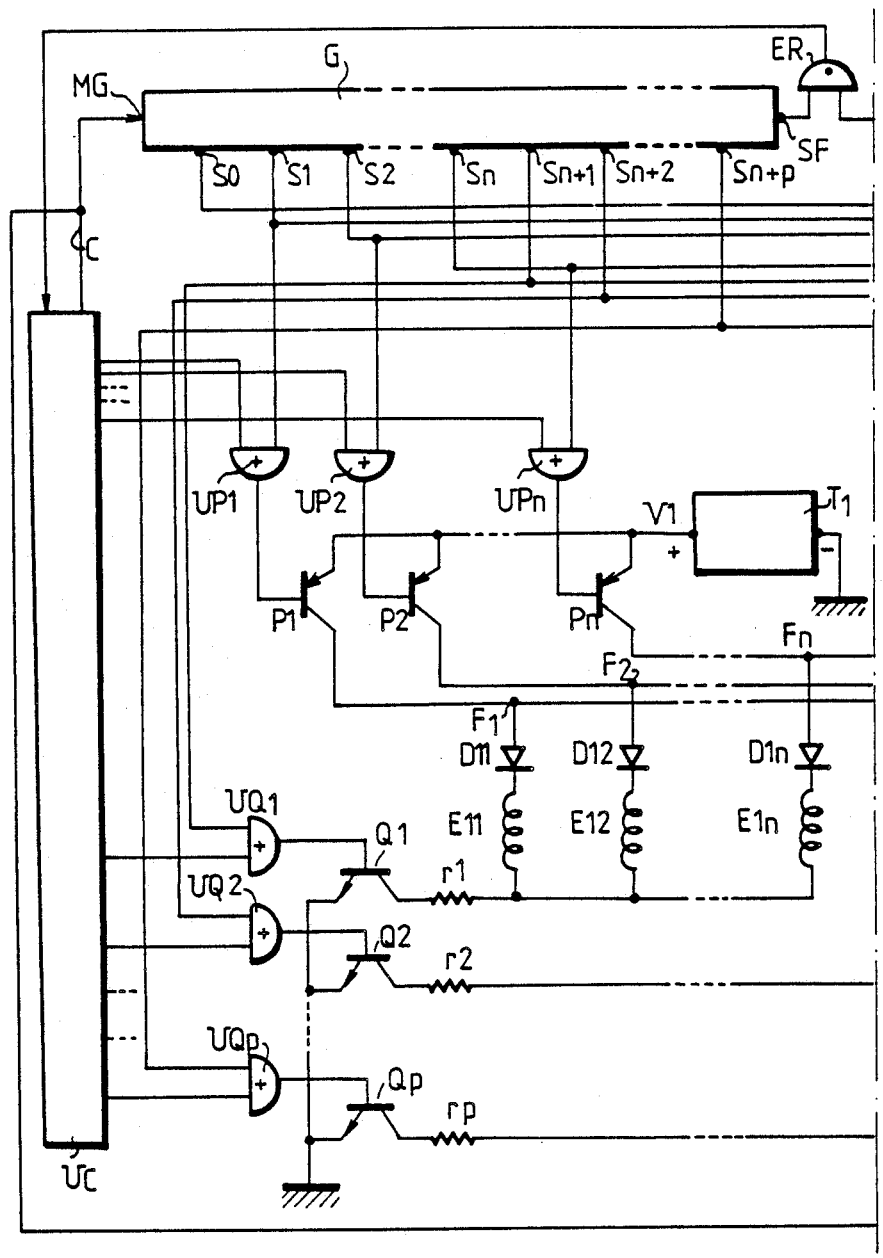
FIGS. 2A, 2B and 2C, when assembled together, are the detailed wiring diagram of a detection device according to the invention, used for detecting defects occurring in the windings and in the excitation control circuit of the heads of a magnetic recoring device.
Figure 2B:
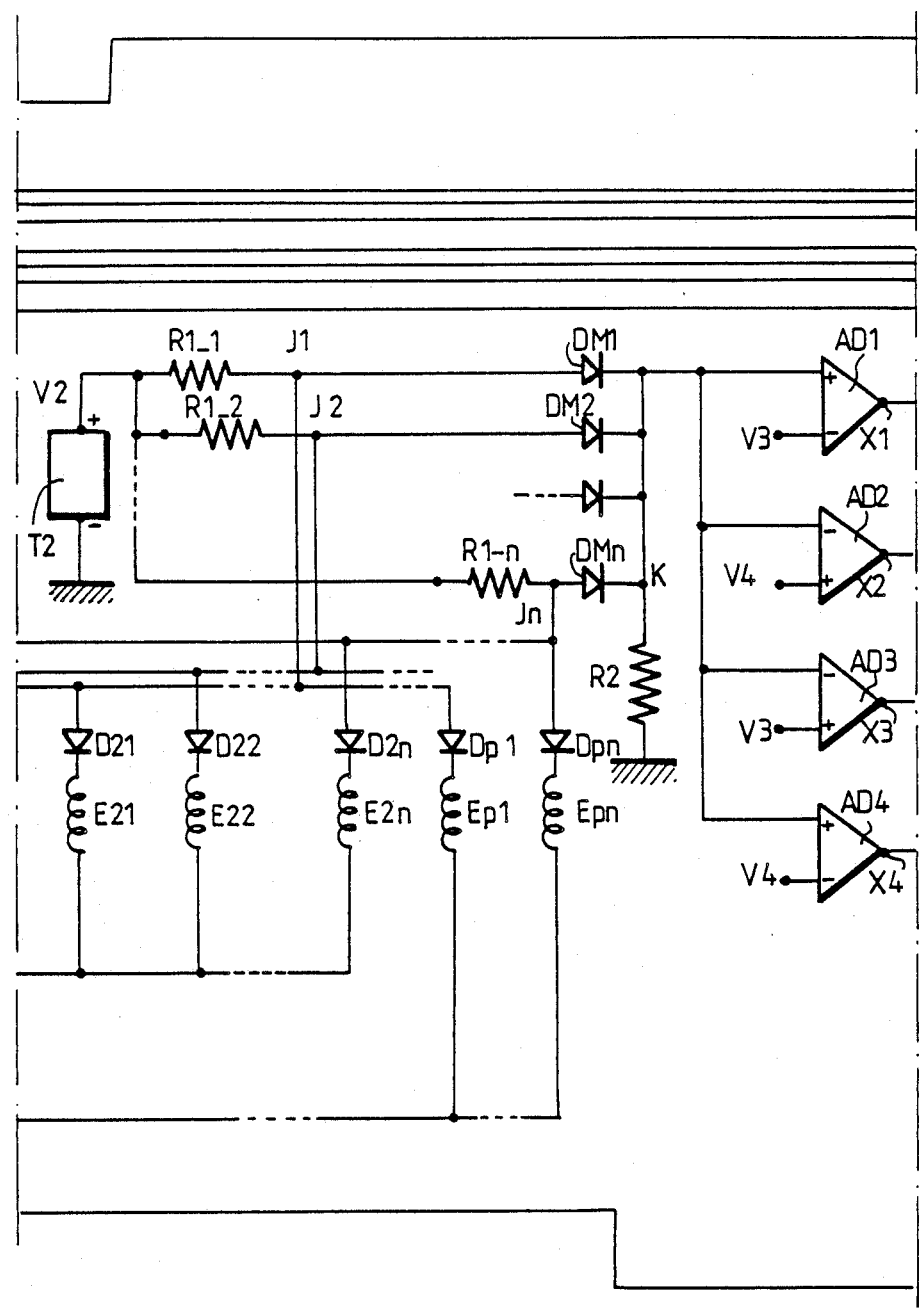
Figure 2C:
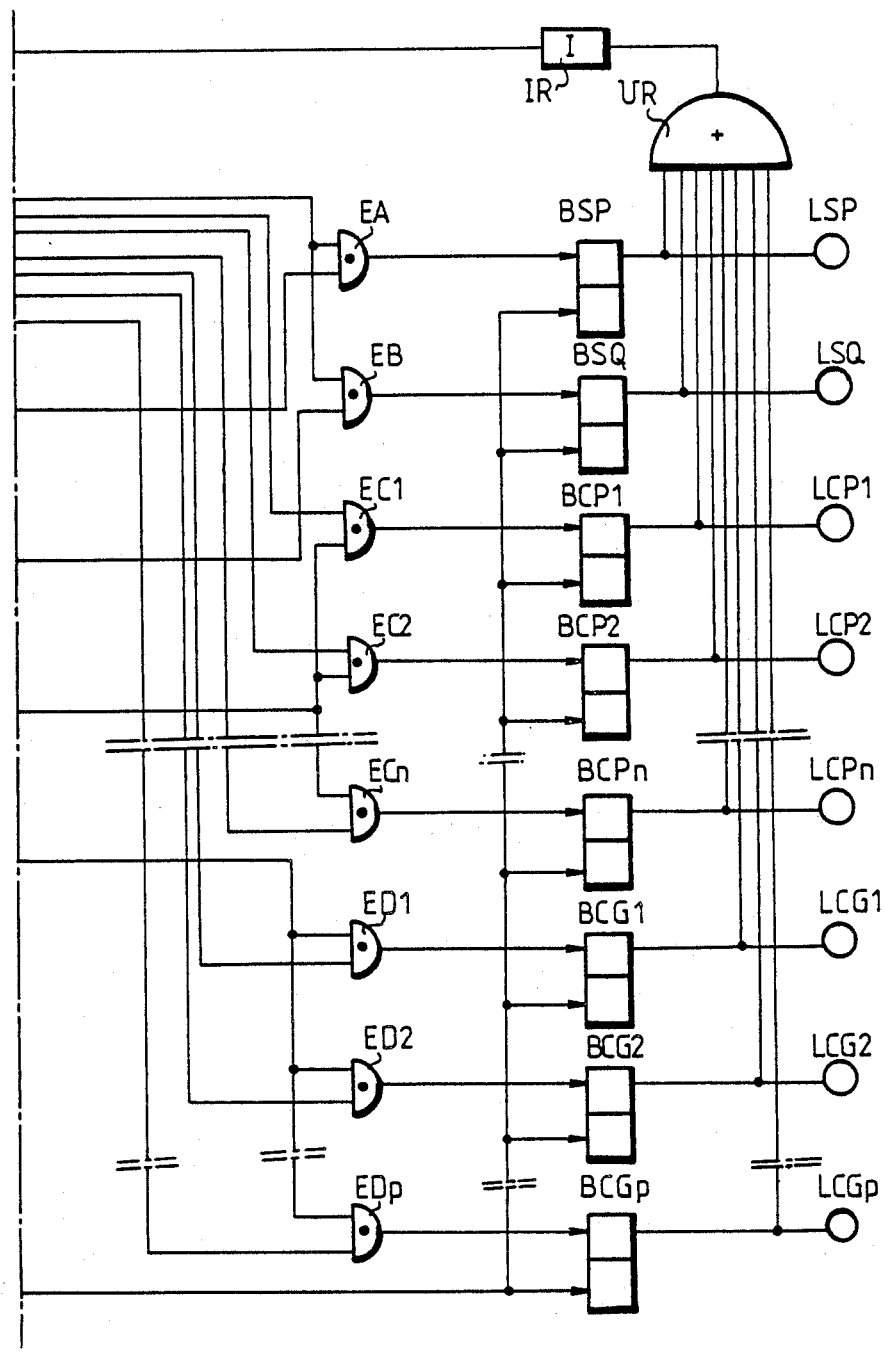

The detection device 10 that is shown in FIG. 1 can be used, with some minor adaptions, to detect cutoffs or short circuits which can occur in an assembly including a plurality of circuit portions. FIGS. 2A, 2B and 2C, assembled as indicated by FIG. 2, show an example of how such a detection device may be arranged to detect defects of a control assembly intended for controlling the windings of magnetic heads of a magnetic recording apparatus, which may for example be the apparatus additionally described in U.S. Pat. No. 4,205,120 (corresponding to French Patent No. 2.402.921). Thus as can be seen in FIGS. 2A, 2B and 2C, this control assembly, which is intended to control the selective excitation of various windings, such as those designated by reference numerals E11, E12, and so forth in these drawing figures, has a matrix-type structure. In other words, in this structure, the various windings are distributed into p groups, each including n windings. Thus the first group includes the windings E11, E12, ..., E1n, the second group includes the windings E21, E22, ..., E2n, and so forth, and the pth group includes the windings Ep1, Ep2, ..., Epn. The selective excitation of these windings is accomplished by means of n first switch devices P1, P2, ..., Pn, which are each associated respectively with one corresponding winding of the n windings of each group, and p second switch devices Q1, Q2, ..., Qp, which are each associated respectively with a corresponding group of the p groups of windings. For example, the switch device P1 is associated with the windings E11, E21, E31, ..., Ep1, the switch device P2 is associated with the windings E12, E22, E32, ..., Ep2, and so forth. Similarly, the switch device Q1 is associated with the first group of windings, that is, the windings E11, E12, ..., E1n, the switch device Q2 is associated with the second group of windings, that is, the windings E21, E22, ..., E2n, and so forth.

In the exemplary embodiment shown in FIGS. 2A, 2B and 2C, these first switch devices P1, P2, ..., Pn comprise p-n-p transistors, each having their emitter connected to the positive terminal of a voltage source T1, while the negative terminal of this source is connected to ground. These transistors have their collector terminal F1, F2, ..., Fn connected to one of the ends of the winding with which they are associated; a diode, such as D11, D12, ..., or Dpn, is connected in series with each of these windings, to prevent the windings from being involuntarily excited by parasitic currents. These transistors may be made conductive selectively for a brief moment, by pulses which are furnished by a control unit UC and applied, via n OR circuits UP1, UP2, ..., UPn, to the bases of these transistors; each of these n OR circuits is associated respectively with a corresponding transistor of these n transistors. It is assumed that the pulses furnished by this control unit UC are positive, and as a consequence, n inverter circuits (not shown) are provided for inverting the circuits which are applied to the bases of these transistors; each of these n inverter circuits are interposed between the base of each of the transistors P1-Pn and the OR circuit associated with that transistor.

Moreover, the second switch devices Q1, Q2, ..., Qp comprise n-p-n transistors each having their emitter connected to ground and their collector connected, via one of p resistors r1, r2, ..., rp, to the other end of the windings of the group with which each of these p transistors is associated. These p transistors may be made conductive selectively for a brief moment, by pulses which are furnished by the control unit UC and are applied via p OR circuits UQ1, UQ2, ..., UQp, to the bases of these transistors, each of these p OR circuits being associated respectively with each of these p transistors.

It should be noted now that the pn windings which are shown on FIGS. 2A, 2B and 2C are part of the constitution of pn magnetic heads, which serve to record data on a magnetic drum driven to rotate continuously. However, this recording is not done continuously; rather, it is interrupted at regular intervals, for a very brief time, slightly before the end of each turn of the drum, to allow the time needed for refilling the memories in the control unit UC that are intended for temporary storage of the data bits used to control the selective excitation of the windings of the magnetic heads. It will be understood then that the selective excitation of the pn windings takes place over the course of periods of time, known as the normal excitation periods, of the windings, each of which is of relatively long duration but shorter than the time required by the drum to rotate once, and that the excitation periods are separated from one another by periods known as non-excitation periods, each of which has a very short duration. It is precisely in the course of these periods of non-excitation that the detection device shown in FIGS. 2A, 2B and 2C is put into action to verify the status of the various circuit portions formed by the transistors P1-

Pn, the transistors Q1-Qp, the pn windings E11, E12, and so forth, as well as the diodes and resistors associated with the windings or transistors.

However, before details on the structure and function of this detection device are provided, it should be noted that in the course of the normal excitation periods of the windings, the selective excitation of these windings is triggered by the pulses that are furnished by the control unit UC and applied to the basis of the transistors P1-Pn and Q1-Qp, these emissions having been effected such that a given instant, at least one of the transistors P1-Pn and at least one of the transistors Q1-Qp are made conducting. For example, if at a given instant the transistors P1, Pn, Q1 and Q2 are made conducting, the windings through which the currents furnished by the source T1 simultaneously flow are the windings E11, E1n, E21 and E2n, as FIGS. 2A and 2B show. It can be seen that on this occasion, the diode D12 prevents a parasite current, originating in the drift of current flowing in the windings E11 and E1n, from flowing through the winding E12 in the opposite direction; the effect of this parasite current, if the diode D12 were omitted, would be to excite not only the winding E12 but also the winding E22.

The detection device that is put into action at the end of each of the normal excitation periods of the windings is substantially of the same structure as that shown in FIG. 1. In FIGS. 2A, 2B and 2C assembled together, the signal generator G, the voltage source T2, the four differential amplifiers AD1, AD2, AD3, and AD4, the resistor R2 and the AND circuits EA and EB are again present. However, because of the number pn of circuit portions to be tested, this detection device includes not a single resistor R1 but rather n resistors R1-1, R1-2, ..., R1-n, each associated respectively with a corresponding switch device of n first switch devices P1-Pn; these n resistors are connected in parallel between the positive terminal of the source T2 and the end K of the resistor R2, and thus, as shown in FIGS. 2A and 2B, these n resistors have one of their ends connected to the positive terminal of T2 and their other end J1, J2, ..., or Jn connected to the terminal F1, F2, ..., or Fn of the first switch device with which they are associated. Furthermore, n diodes DM1, DM2, ..., DMn are each disposed respectively between each of these other ends J1, J2, ..., Jn and the end K of the resistor R2, to prevent the flow of parasitic currents. Moreover, the signal generator G includes instead of three outputs, n+p+1 outputs, which in FIG. 2A are represented as S0, S1, S2, ..., Sn, Sn+1, Sn+2, ..., Sn+p; the pulses furnished at the output S0 are intended to be applied to one of the inputs of the circuits EA and EB. The outputs S1, S2, ..., Sn of the generator G are each connected respectively, on the one hand via one of OR circuits UP1, UP2, ..., UPn, to the base of a corresponding transistor of the transistors P1, P2, ..., Pn, and on the other hand to one of the inputs of a corresponding AND circuit of n AND circuits EC1, EC2, ..., ECn, these n AND circuits having their other input connected to the output X3 of the differential amplifier AD3. The outputs Sn+1, Sn+2, ..., Sn+p of the generator G are each connected respectively, on the one hand via one of OR circuit UQ1, UQ2, ..., UQp, to the base of a corresponding transistor of transistors Q1, Q2, ..., Qp, and on the other hand to one of the inputs of a corresponding AND circuit of p AND circuits ED1, ED2, ..., EDp, these p AND circuits having their other input connected to the output X4 of the differential amplifier AD4. Finally, to permit memorization of the signals of brief duration furnished by the circuits EA, EB, EC1, EC2, ..., ECn, ED1, ED2, ..., EDp, the detection device also includes (n+p+2) multivibrators, identified in FIG. 2C by reference symbols BSP, BSQ, BCP1, BCP2, ..., BCPn, BCG1, BCG2, ..., BCGp; these multivibrators are each associated with a corresponding circuit of the circuits EA, EB, EC1, EC2, ..., ECn, ED1, ED2, ..., EDp, and each of these multivibrators has its "normal" input connected to the output of the one of the AND circuits with which it is associated. The resetting to zero of these multivibrators is assured, as will be seen hereinafter, by a pulse furnished by the control unit UC and applied to the "complementary" input of all of these multivibrators.

The positive voltage that appears at the "normal" output of each of the multivibrators BSP, BSQ, BCP1, BCP2, ..., BCPn, BCG1, BCG2, ..., BCGp when these multivibrators are in the "1" state, is applied on the one hand to each of (n+p+2) visual indicator elements LSP, LSQ, LCP1, LCP2, ..., LCPn, LCG1, LCG2, ..., LCGp, each of these being associated with each of these multivibrators, and on the other hand, via an OR circuit UR, to the input of an inverter circuit IR, which has its output connected to one of the two inputs of an AND circuit ER to be described below. These (n+p+2) visual indicator elements, in the form of lights, are intended to indicate to the operator, when they light up, that a defect has been detected in the circuit portions to be tested.

It should be noted that in the device that has just been described, each of the resistors R1-1, R1-2, ..., R1-n has a value equal to that of the resistor R1 mentioned above, and each of the resistors r1, r2, ..., rp has a value equal to that of the resistor r described above. Similarly, it is assumed that in the example represented by FIGS. 2A, 2B and 2C, the following values apply:

V1 = 12 Volts,
V2 = 5 Volts,
V3 = 7 Volts, and
V4 = 2 Volts, such that:

V5 = 4 Volts, and
V6 = 25 mV.

The functioning of the detection device shown in FIGS. 2A, 2B and 2C is similar to that of the detection device illustrated in FIG. 1. However, it should be noted that this function is triggered by a pulse that is transmitted over a conductor C (FIG. 2A) by the control unit UC at the end of a normal excitation period of the windings E11, E12, ..., Epn, and applied on the one hand to the "complementary" input of the multivibrators, in order to reset them to 0, and on the other hand to the input MG of the signal generator G. In response to this pulse, the generator G furnishes a pulse successively at each of its outputs S0, S1, S2, ..., Sn+p. Thus the first pulse is furnished at the output S0 of this generator, and is applied to one of the inputs of the circuits EA and EB.

If none of the transistors P1-Pn and Q1-Qp is short circuiting, the point K is carried, as explained above, to the potential V5. In that case, no signal appears at the outputs X1 and X2 of AD1 and AD2, and consequently the circuits EA and EB furnish no signal at their output, so that the multivibrators BSP and BSQ remain at 0.

On the other hand, if at least one of the transistors P1-Pn is short-circuiting, the point K is carried to the potential V1. In that case, a signal appears at the output X1 of AD1, which causes a signal to appear at the output of the circuit EA, which when applied to the normal input of the multivibrator BSP has the effect of putting this multivibrator in the "1" state and thus of exciting the element LSP.

Now if none of the transistors P1-Pn is short-circuiting but at least one of the transistors Q1-Qp is short-circuiting, the point K is carried to the potential V6, that is, a potential close to 0. In that case, a signal appears at the output X2 of AD2, which causes a signal to appear at the output of the circuit EB, which then has the effect of shifting the multivibrator BSQ to the "1" state and thus of exciting the element LSQ.

The second pulse that is then furnished at the output S1 of the generator G is applied on the one hand, after inversion, to the base of the transistor P1, which has the effect of making this transistor conducting, and on the other hand to one of the inputs of the circuit EC1.

If no cutoff has occurred in the circuit portion included between the + terminal of T1 and the collector terminal F1 of the transistor P1, the point K is carried to the potential V1. In that case, no signal appears at the output X3 of AD3, and consequently the circuit EC1 furnishes no signal at its output, so that the multivibrator BCP1 remains in the "0" state.

On the other hand, if a cutoff does occur in this circuit portion, the point K is carried to the potential V5. In that case, a signal appears at the output X3 of AD3. Consequently, a signal appears at the output of EC1, which has the effect of shifting the multivibrator BCP1 to the "1" state and of exciting the element LCP1.

Similarly, the third pulse that is then furnished at the output S2 of the generator G is applied on the one hand, after inversion, to the base of the transistor P2, which makes this transistor conducting, and on the other hand to one of the inputs of the circuit EC2. In the same manner as above, it will be seen that in the absence of a cutoff in the circuit portion included between the + terminal of Ta and the collector terminal F2 of the transistor P2, the multivibrator BCP2 remains in the "0" state, while if a cutoff has occurred in this portion, the multivibrator BCP2 shifts to the "1" state and excites the element LCP2.

The actions brought about by the pulses that are then furnished successively at the outputs S3, S4, ..., Sn of the generator G will not be described here, because they are similar to those caused by the pulses furnished at the outputs S1 and S2 of this generator. It will simply be noted that if in general a cutoff has occurred in any of the circuit portions in which the transistors P3, P4, ..., Pn are located, this cutoff will be signalled by the shift to the "1" state of the corresponding multivibrator, such that from the lighting up of the elements LCP3, LCP4, ..., LCPn, the operator can determine in which circuit or portions a cutoff has been detected.

The pulse that is furnished at the output Sn+1 of the generator G is applied both to the base of the transistor Q1, which makes this transistor conducting, and to one of the inputs of the circuit ED1.

If no cutoff has taken place in any of the circuit portions, each respectively comprising each of the windings E11, E12, ..., E1n of the first group, each of the diodes D11, D12, ..., D1n associated with the windings, and the resistor r1 and the transistor Q1, then the point K is carried to the potential V6. In that case, no signal appears at the output X4 of AD4, and consequently the circuit ED1 does not furnish any signal at its output. Consequently the multivibrator ECG1 remains in the "0" state.

Contrarily, if a cutoff has occurred in any of the above circuit portions, for example in the circuit portion including the diode D12, the winding E12, the resistor r1 and the transistor Q1, then the point K is carried to the potential V5. In that case, a signal does appear at the output X4 of AD4. Consequently, a signal appears at the output of ED1, which has the effect of shifting the multivibrator ECG1 to the "1" state and thus of exciting the element LCG1.

Similarly, the pulse which is then furnished at the output Sn+2 of the generator G is applied on the one hand to the base of the transistor Q2, which makes this transistor conducting, and on the other hand to one of the inputs of the circuit ED2. In the same manner as above, it will be seen that in the case where no cutoff has taken place in any of the circuit portions, each comprising each of the windings E21, E22, ..., E2n of the second group, each of the diodes D21, D22, ..., D2n associated with these windings, and the resistor r2 and the transistor Q2, the multivibrator BCG2 remains in the "0" state, while if a cutoff has occurred in any of these circuit portions, the multivibrator BCG2 shifts to the "1" state and then excites the element LCG2.

The actions brought about by the pulses that are then furnished successively at the outputs Sn+3, Sn+4, ..., Sn+p of the generator G will not be described here, because they are similar to those caused by the pulses furnished at the outputs Sn+1 and Sn+2 of this generator. It will simply be noted that if in general a cutoff has occurred in any of the circuit portions each respectively comprising each of the windings Ei1, Ei2, ..., Ein, of the i'th group, each of the diodes Di1, Di2, ..., Din associated with these windings, and the resistor ri and the transistor Qi, this cutoff would be signalled by the shift of the multivibrator BCGi to "1", such that, at the end of monitoring of the circuit portions of the first group, from the lighting up of the elements LCG1, LCG2, ..., LCGp, in which groups at least one cutoff has been detected among the n circuit portions of each of these groups. Thus, for example, the lighting up of the element LCG3 will signify that T least one cutoff has taken place among the n circuit portions of the third group, that is, among the circuit portions each respectively comprising each of the windings E31, E32, ..., E3n, and each of the diodes D31, D32, ..., D3n which are associated with these windings, and the resistor r3 and the transistor Q3.

In the example shown in FIG. 2A, the signal generator G is also provided with a supplementary output SF, and it is arranged so that after having furnished the (n+p+1)th pulse at its output Sn+p, it will furnish a final pulse at this output SF, which is then applied to one of the two inputs of the AND circuit ER, the other input of this circuit being connected as noted above to the output of the inverter circuit IR.

In the case where after the (n+p+1)th pulse furnished by the output Sn+p of the generator G has been applied to one of the inputs of the circuit EDp and no defect has been detected, that is, in the case where all the multivibrators BSP, BSQ, BCP1, BCP2, ..., BCPn, BCG1, BCG2, ..., BCGp have remained in the "0" state, no positive voltage is applied to each of the inputs of the circuit UR. Consequently, no positive voltage appears at the output of this circuit UR, and consequently a positive voltage is furnished to the output of the inverter IR and is applied to one of the inputs of the circuit ER. Under these conditions, when this circuit ER receives the final pulse transmitted by the output SF of the generator G, it furnishes a signal at its output and transmits it to the control unit UC, and this signal thus makes it possible to inform the control unit of the absence of a defect within the assembly that has been monitored by the detection device. In response to the reception of this signal, the control unit UC can then, in the course of a new normal excitation period, recommence transmitting the pulses serving to trigger the selective excitation of the windings E11, E12, ..., Epn, in th manner described in detail above.

Contrarily, in the case where at least one defect has been detected after the transmission of the (n+p+1)th pulse by the generator G, at least one of the (n+p+2) multivibrators is then in the "1" state. Consequently, a positive voltage is presented to the output of the circuit UR, such that the inverter IR does not furnish any positive voltage at its output. As a result, when the generator G furnishes a final pulse at its output SF, the circuit ER, in response to receiving this pulse, furnishes no signal at its output, and so the control unit UC, since it receives no signal at the end of the period of nonexcitation, or in other words at the end of the period during which the detection device in action, is thus informed of the presence of at least one defect in the assembly that has been monitored by this device, and can thus stop the transmission of pulses intended to trigger the selective excitation of the windings.

It should be noted that the period during which the detection device is in action is generally quite short, compared with the normal excitation period of the windings. For example, when this detection device is used to monitor the circuits controlling the excitation of windings of the heads used for recording data on a magnetic drum driven to rotate at the speed of one turn per second, this device is capable of monitoring control circuits of an assembly including approximately 160 windings within a period of time on the order of 30 ms, which is quite short in comparison with the period, of slightly less than one second in duration, during which these windings are selectively excited.

What is claimed is:

1. A detecting device for detecting cutoffs and short circuit defects occurring in at least one electrical circuit portion (11) having at least one passive, non-capacitive element (E) including a first end (F) and a second end (H), a first switch device (P) mounted between said first end (F) and a first terminal of a first source of direct voltage (T1), and a second switch device (Q) mounted between said second end (H) and a second terminal of said voltage source (T1), said detecting device comprising discriminator circuit means (AD1, AD2, AD3, AD4), having an input (K) connected to said first end (F) and four outputs (X1, X2, X3, X4), and operatively arranged for furnishing a different configuration of signals at its outputs, depending on whether each of the two parts of the circuit portion located on either side of said first end (F) have a cutoff defect or a short-circuit defect, consecutive to the actuation of the two switch devices (P and Q).

2. A detection device as defined by claim 1, characterized in that with the first terminal of the first voltage source (T1) being the positive terminal (+) and the second terminal of said first source being the negative terminal (−), the discriminator circuit means is operatively arranged so that when said first and second switch devices (P and Q) are urged in the opening position it furnishes a signal at its first output (X) in the case where said first switch device (P) has a short-circuiting defect, and it furnishes a signal at its second output (X2) in the case where said second switch device (Q) has a short-circuiting defect, said discriminator circuit means being further operatively arranged so that when only said first switch device (P) is urged in the closing portion it furnishes a signal at its third output (X3) in the case where a cutoff has occurred between said first end (F) and said positive terminal (+) of the voltage source, and when solely said second switch device (Q) is urged in the closing position it furnishes a signal at its fourth output (X4) in the case where a cutoff has occurred in the part of said circuit portion that is included between said first end (F) and the negative terminal (−) of this voltage source.

3. A detection device as defined by claim 2, characterized in that it further includes:
a second source of direct voltage (T2) having a positive terminal (+) and a negative terminal (−) connected to the negative terminal (−) of the first source of direct voltage (T1),
a first resistor (R1) connected between the first end (F) of the passive element (E) and the positive terminal (+) of said second voltage source (T2),
and a second resistor (R2) having a first end (K) connected to the first end (F) of the passive element (E) and having its other end connected to the negative terminal (−) of said second voltage source (T2),
said first and said second resistors (R1 and R2) each having value substantially greater than that of the resistor (r) of said passive element, said first and said second resistors and said second voltage source (T2) being arranged such that when the two switch devices (P and Q) are placed in the opening position, said first end (K) of the second resistor is carried to a positive potential the value (V5) of which is notably less than that (V1) of the potential of the positive terminal (+) of the first voltage source (T1).

4. A detection device as defined by claim 2, characterized in that to permit the detection of cutoffs and short circuit defects in an assembly including on the one hand pn passive elements (E11, E12, ..., E1n, ..., Epn) distributed into p groups each including n passive elements (such as E11, E12, ..., E1n), and on the other hand n first switch devices (P1, P2, ..., Pn) each associated respectively with each of the n elements of each group, and p second switch devices (Q1, Q2, ..., Qp) each associated respectively with each of these p groups, each of these pn elements having a first end (F1) connected to the positive terminal (+) of the first voltage source (T1) via the first switch device associated with that element, and a second end connected to the negative terminal (−) of this source via the second switch device which is associated with the group to which this element belongs, and further including
a second source of direct voltage T(2) having a negative terminal (−) connected to the negative terminal (−) of the first source of direct voltage (T1), and a positive terminal (+),
n first resistors (R1-1, R1-2, ..., R1-n), each associated respectively with each of the n elements of each group, each of these resistors having one of its ends connected to the positive terminal (+) of said second voltage source (T2), and its second end (J1)

connected to the first end (F1) of the passive element which is associated with the first resistor, and a second resistor (R2) having a first end (K) connected, via one of n diodes (such as DM1), to the other end (J1) of each of said first resistors, and a second end connected to the negative terminal (−) of said second voltage source (T2), said n first resistors all having the same resistance, the resistance of each of them and the resistance of the second resistor being very high, compared with that of the resistor (such as r1) of each of said passive elements, said first resistors, said second resistor and said second voltage source being arranged such that when said first and second switch devices are in the opening position, said first end (K) of said second resistor (R2) is carried to a positive potential the value (V5) of which is notably less than that (V1) of the potential of the positive terminal (+) of the first voltage source (T1).

5. A detection device as defined by claim 3, characterized in that the value (V5) of the potential of the first end (K) of the second resistor (R2), when the first and second switch devices are open, is practically equal to one-third the value (V1) of the potential of the positive terminal (+) of the first voltage source (T1).

6. A detection device as defined by claim 3, characterized in that the discriminator circuit comprises four differential amplifiers (AD1, AD2, AD3, AD4), each provided with an inverting input (−) and a non-inverting input (+), the inverting inputs (−) of the second and third amplifiers (AD2 and AD3) and the non-inverting inputs (+) of the first and fourth amplifiers AD1 and AD4 being connected among one another to the first end (K) of the second resistor (R2), and the inverting input (−) of the first amplifier (AD1) and the non-inverting input (+) of the third amplifier (AD3) being connected to a first terminal of reference potential, the value (V3) of which is between the value (V1) of the potential of the positive terminal of the first source (T1) and the value (V5) of the potential of said first end (K) when all the switch devices (P, Q or P1, P2, . . . , Pn, Q, Q2, . . . , Qp) are placed in the opening position, and the non-inverting input (+) of the second amplifier (AD2) and the inverting input (−) of the fourth amplifier (AD4) being connected to a second terminal of reference potential, the value (V4) of which is less than the value (V5) of the potential of this first end when all these switch devices are placed in the opening position.

7. A detection device as defined by claim 6, characterized in that it further includes:

a first validation circuit (EA) and a second validation circuit (EB), these two circuits being each provided with one output and two inputs, one of which is a validation input and the other input of each of these two circuits being connected respectively to each of the outputs (X1 and X2) of the first and second amplifiers (AD1 and AD2), and a signal generator (G) provided with an output (S0) connected to the validation input of each of the two validation circuits (EA, EB), this generator being arranged to furnish at its output a validation signal at a given instant and thus to apply this signal simultaneously to these two validation circuits, such that if at this instant a first switch device (P, P1, P2, . . . , or Pn) has a short-circuiting defect, an indicator appears at the output of the first validation circuit (EA), while if at this same instant a second switch device (Q, Q1, Q2, . . . , or Qp) has a short-circuiting defect, an indicator signal appears at the output of the second validation circuit (EB).

8. A detection device as defined by claim 7, characterized in that the signal generator (G) is further provided with n outputs (S1, S2, . . . , Sn), each respectively connected to each of the n first switch devices (P1, P2, . . . , Pn) and with p outputs (Sn+1, Sn+2, . . . , Sn+p), each connected respectively with each of the p second switch devices (Q1, Q2, . . . , Qp), this generator being arranged to furnish a validation signal successively at each of its (n+p+1) outputs, so that in response to the reception of these validation signals, these (n+p) switch devices will be successively urged into the closing position, the instants at which these validation signals are furnished and the durations of these signals being such that only one at a time of these switch devices are urged into this position.

9. A detection device as defined by claim 8, characterized in that it further includes a first assembly including n validation circuits (EC1, EC2, . . . , ECn), each associated respectively with each of the n first switch devices (P1, P2, . . . , Pn) and each provided with one output and two inputs, one of which is a validation input and the other inputs of these n circuits being connected to the output (X3) of the third amplifier (AD3), the validation inputs of these n circuits being connected each respectively to each of the n outputs (S1, S2, . . . , Sn) of the signal generator (G) so as likewise to receive the validation signals which are furnished successively at these outputs, such that if at the moment when any of said first switch devices is urged into the closing position of this switch device has a cutoff defect, an indicator signal appears at the output of the validation circuit that is associated with that switch device.

10. A detection device as defined by claim 9, characterized in that it further includes a second assembly of p circuits (ED1, ED2, . . . , EDp), each associated respectively with each of p second switch devices (Q1, Q2, . . . , Qp) and each being provided with one output and two inputs, one of which is a validation input and the other inputs of these p circuits being connected to the output (X4) of the fourth amplifier (AD4), the validation inputs of these p circuits being connected each respectively to each of the p outputs (Sn+1, Sn+2, . . . , Sn+p) of the signal generator (G) so as likewise to receive the validation signals which are furnished successively at these outputs, such that if at least one of the circuit portions including this second switch device and the n passive elements of the group with which it is associated has a cutoff defect at the moment when any of said second switch devices is urged into the closing position, an indicator signal appears at the output of the validation circuit which is associated with this second switch device.

11. A detection device as defined by claim 4 characterized in that the value (V5) of the potential of the first end (K) of the second resistor (R2), when the first and second switch devices are open, is practically equal to one-third of the value (V1) of the potential of the positive terminal (+) of the first voltage source (T1).

12. A detection device as defined by claim 4 characterized in that the discriminator circuit comprises four differential amplifiers (AD1, AD2, AD3, AD4), each provided with an inverting input (−) and a non-inverting input (+), the inverting inputs (−) of the second and third amplifiers (AD2 and AD3) and the noninverting inputs (+) of the first and fourth amplifiers (AD1 and AD4) being connected among one another to the first end (K) of the second resistor (R2), and the inverting input (−) of the first amplifier (AD1) and the non-inverting input (+) of the third amplifier (AD3) being connected to a first terminal of reference potential, the value (V3) of which is between the value (V1) of the potential of the positive terminal of the first source (T1) and the value (V5) of the potential of said first end (K) when all the switch devices (P, Q or P1, P2, ..., Pn, Q1, Q2, ..., Qp) are placed in the opening position, and the non-inverting input (+) of the second amplifier (AD2) and the inverting input (−) of the fourth amplifier (AD4) being connected to a second terminal of reference potential, the value (V4) of which is less than the value (V5) of the potential of this first end when all these switch devices are placed in the opening position.

13. A detection device as defined by claim 12, characterized in that it further includes:
a first validation circuit (EA) and a second validation circuit (EB), these two circuits being each provided with one output and two inputs, one of which is a validation input and the other input of each of these two circuit being connected respectively to each of the outputs (X1 and X2) of the first and second amplifiers (AD1 and AD2),
and a signal generator (G) provided with an output (SO) connected to the validation input of each of the two validation circuits (EA, EB), this generator being arranged to furnish at its output a validation signal at a given instant and thus to apply this signal simultaneously to these two validation circuits, such that if at this instant a first switch device (P, P1, P2, ..., or Pn) has a short-circuiting defect, an indicator appears at the output of the first validation circuit (EA), while if at this same instant a second switch device (Q, Q1, Q2, ..., or Qp) has a short-circuiting defect, an indicator signal appears at the output of the second validation circuit (EB).

14. A detection device as defined by claim 13, characterized in that the signal generator (G) is further provided with n outputs (S1, S2, ..., Sn), each respectively connected to each of the n first switch devices (P1, P2, ..., Pn) and with p outputs (Sn+1), (Sn+2), ... Sn+p), each connected respectively with each of the p second switch devices (Q1, Q2, ..., Qp), this generator being arranged to furnish a validation signal successively at each of its (n+p+1) outputs, so that in response to the reception of these validation signals, these (n+p) switch devices will be successively urged into the closing position, the instants at which these validation signals are furnished and the durations of these signals being such that only one at a time of these switch devices are urged into this position.

15. A detection device as defined by claim 14, characterized in that it further includes a first assembly including n validation circuits (EC1, EC2, ..., ECn), each associated respectively with each of the n first switch devices (P1, P2, ..., Pn) and each provided with ont output and two inputs, one of which is a validation input and the other inputs of these n circuits being connected to the output (X3) of the third amplifier (AD3), the validation inputs of these n circuits being connected each respectively to each of the n outputs (S1, S2, ..., Sn) of the signal generator (G) so as likewise to receive the validation signals which are furnished successively at these outputs, such that if at the moment when any of said first switch devices is urged into the closing position this switch device has a cutoff defect, an indicator signal appears at the output of the vaidation circuit that is associated with that switch device.

16. A detection device as claimed in claim 15, characterized in that it further includes a second assembly of p circuits (ED1, ED2, ..., EDp), each associated respectively with each of the p second switch devices (Q1, Q2, ..., Qp) and each being provided with one output and two inputs, one of which is a validation input and the other inputs of these p circuits being connected to the output (X4) of the fourth amplifier (AD4), the validation inputs of these p circuits being connected each respectively to each of the p outputs (Sn+1, Sn+2, ..., Sn+p) of the signal generator (G) so as to likewise to receive the validation signals which are furnished successively to these outputs, such that if at least one of the circuit portions including this second switch device and the n passive elements of the group with which it is associated has a cutoff defect at the moment when any of said second switch devices is urged into the closing position, an indicator signal appears at the output of the validation circuit which is associated with this second switch device.

17. A detection device as defined by claim 5 characterized in that the discriminator circuit comprises four differential amplifiers (AD1, AD2, AD3, AD4), each provided with an inverting input (−) and a non-inverting input (+), the inverting inputs (−) of the second and third amplifiers (AD2 and AD3) and the non-inverting inputs (+) of the first and fourth amplifiers (AD1 and AD4) being connected among one another to the first end (K) of the second resistor (R2), and the inverting input (−) of the first amplifier (AD1) and the non-inverting input (+) of the third amplifier (AD3) being connected to a first terminal of reference potential, the value (V3) of which is between the value (V1) of the potential of the positive terminal of the first source (T1) and the value (V5) of the potential of said first end (K) when all the switch devices (P, Q or P1, P2, ..., Pn, Q1, Q2, ..., Qp) are placed in the opening position, and the non-inverting input (+) of the second amplifier (AD2) and the inverting input (−) of the fourth amplifier (AD4) being connected to a second terminal of reference potential, the value (V4) of which is less than the value (V5) of the potential of this first end when all these switch devices are placed in the opening position.

18. A detection device as defined by claim 17, characterized in that it further includes:
a first validation circuit (EA) and a second validation circuit (EB), these two circuits being each provided with one output and two inputs, one of which is a validation input and the other input of each of these two circuits being connected respectively to each of the outputs (X1 and X2) of the first and second amplifiers (AD1 and AD2),
and a signal generator (G) provided with an output (SO) connected to the validation input of each of the two validation circuits (EA, EB), this generator being arranged to furnish at its output a validation signal at a given instant and thus to apply this signal simultaneously to these two validation circuits, such that if at this instant a first switch device (P, P1, P2, ..., or Pn) has a short-circuiting defect, an indicator appears at the output of the first validation circuit (EA), while if at this same instant a second switch device (Q, Q1, Q2, ..., or Qp) has a short-circuiting defect, an indicator signal appears at the output of the second validation circuit (EB).

19. A detection device as defined by claim 18, characterized in that the signal generator (G) is further provided with n outputs (S1, S2, ..., Sn), each respectively connected to each of the n first switch devices (P1, P2, ..., Pn) and with p outputs (Sn+1), Sn+2), ... Sn+p), each connected respectively with each of the p second switch devices (Q1, Q2, ..., Qp), this generator being arranged to furnish a validation signal successively at each of its (n+p+1) outputs, so that in response to the reception of these validation signals, these (n+p) switch devices will be successively urged into the closing position, the instants at which these validation signals are furnished and the durations of these signals being such that only one at a time of these switch devices are urged into this position.

20. A detection device as defined by claim 19, characterized in that it further includes a first assembly including n validation circuits (EC1, EC2, ..., ECn), each associated respectively with each of the n first switch devices (P1, P2, ..., Pn) and each provided with ont output and two inputs, one of which is a validation input and the other inputs of these n circuits being connected to the output (X3) of the third amplifier (AD3), the validation inputs of these n circuits being connected each respectively to each of the n outputs (S1, S2, ..., Sn) of the signal generator (G) so as likewise to receive the validation signals which are furnished successively at these outputs, such that if at the moment when any of said first switch devices is urged into the closing position this switch device has a cutoff defect, an indicator signal appears at the output of the validation circuit that is associated with that switch device.

21. A detection device as claimed by claim 20, characterized in that it further includes a second assembly of p circuits (ED1, ED2, ..., EDp), each associated respectively with each of the p second switch devices (Q1, Q2, ..., Qp) and each being provided with one output and two inputs, one of which is a validation input and the other inputs of these p circuits being connected to the output (X4) of the fourth amplifier (AD4), the validation inputs of these p circuits being connected each respectively to each of the p outputs (Sn+1, Sn+2, ..., Sn+p) of the signal generator (G) so as likewise to receive the validation signals which are furnished successively at these outputs, such that if at least one of the circuit portions including this second switch device and the n passive elements of the group with which it is associated has a cutoff defect at the moment when any of said second switch devices is urged into the closing position, an indicator signal appears at the output of the validation circuit which is associated with this second switch device.

* * * * *

UNITED STATES PATENT AND TRADEMARK OFFICE
CERTIFICATE OF CORRECTION

PATENT NO. : 4,890,183
DATED : December 26, 1989
INVENTOR(S) : Robert Champiau

It is certified that error appears in the above-identified patent and that said Letters Patent is hereby corrected as shown below:

Abstract, line 12 "$V_4$" should be -- V4 --.

Claim 2, Col. 16, line 1 "(X)" should be -- (X1) --.

Claim 4, Col. 16, line 60 "T(2)" should be -- (T2) --.

Claim 6, Col. 17, line 33 "ADI and AD4)" should be -- (ADI and AD4) --.

Claim 6, Col. 17, line 42 "P2, ..., Pn,Q,Q2," should be -- P2, ..., Pn,Q1,Q2, --.

Claim 13, Col. 19, line 25 "circuit" should be -- circuits --.

Claim 15, Col. 19 line 61 "ont" should be -- one --.

Claim 20, Col. 21, line 24 "ont" should be -- one --.

Signed and Sealed this

Nineteenth Day of February, 1991

*Attest:*

HARRY F. MANBECK, JR.

*Attesting Officer*   Commissioner of Patents and Trademarks